United States Patent
Beckert et al.

(10) Patent No.: US 7,679,149 B2
(45) Date of Patent: Mar. 16, 2010

(54) METHOD OF REMOVING REFRACTORY METAL LAYERS AND OF SILICIDING CONTACT AREAS

(75) Inventors: Audrey Beckert, Dresden (DE); Matthias Goldbach, Dresden (DE); Clemens Fitz, Dresden (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/669,500

(22) Filed: Jan. 31, 2007

(65) Prior Publication Data
US 2008/0029835 A1 Feb. 7, 2008

(30) Foreign Application Priority Data
Jan. 31, 2006 (DE) .................. 10 2006 004 396

(51) Int. Cl.
*H01L 29/76* (2006.01)
(52) U.S. Cl. .................. 257/412; 257/E29.156; 257/E29.161; 438/592; 438/699

(58) Field of Classification Search ............... 257/412, 257/E29.156
See application file for complete search history.

(56) References Cited

U.S. PATENT DOCUMENTS

| 6,387,786 B1 * | 5/2002 | Erhardt et al. ............ 438/586 |
| 6,743,721 B2 | 6/2004 | Lur et al. |
| 2004/0115952 A1 | 6/2004 | Kim et al. |
| 2005/0275046 A1 * | 12/2005 | Goldbach et al. ........... 257/412 |

* cited by examiner

*Primary Examiner*—Tu-Tu V Ho
(74) *Attorney, Agent, or Firm*—Dicke, Billig & Czaja, PLLC

(57) ABSTRACT

A method of formation of contacts with cobalt silicide since is disclosed. For example, after siliciding with the SOM solution, both unreacted sections of the deposition layer including, for example, cobalt as initial layer for the siliciding and an oxidation protection layer including titanium and deposited by means of cathode beam sputtering, for instance, may be removed rapidly and with high selectivity relative to the cobalt silicide and other, densified metal structures and metal layers.

12 Claims, 3 Drawing Sheets

METHOD OF REMOVING REFRACTORY METAL LAYERS AND OF SILICIDING CONTACT AREAS

CROSS-REFERENCE TO RELATED APPLICATIONS

This Utility patent application claims priority to German Patent Application No. DE 10 2006 004 396.0 filed on Jan. 31, 2006, which is incorporated herein by reference.

BACKGROUND

The switching speed and power consumption of semiconductor devices are closely linked to line and junction resistances within the semiconductor device. In order to reduce the line resistances, the connecting lines within the semiconductor device are provided from metals. In the case of field effect transistors, the junction resistance between the source/drain regions formed within a monocrystalline semiconductor substrate and a metallized contact structure that bears on the semiconductor substrate and connects the source/drain region to connecting lines formed in a metallization level above the semiconductor substrate remains critical. In order to reduce the junction resistance, the metal silicide is formed along the junction areas between the silicon substrate and the contact structure, the electrical resistance of said metal silicide being lower than that of a silicon/metal junction.

A suitable metal silicide is cobalt silicide. For the purpose of siliciding (silicidation), a cobalt layer is applied to the silicon substrate and subjected to heat treatment at a silicidation temperature of approximately 550 degrees Celsius. Sections of the cobalt layer that adjoin the silicon substrate react with the silicon of the silicon substrate to form cobalt monosilicide. Unreacted sections of the cobalt layer are removed.

During the siliciding, the formation of poorly conducting cobalt oxide at the surface of the cobalt layer and also the formation of cobalt silicide agglomerates can occur even in pure nitrogen environment due to oxygen that outdiffuses from the substrate. Therefore, the cobalt layer is covered by an oxidation protection layer prior to silicidation. For the oxidation protection layer, a material is chosen which reacts more readily with the oxygen than the cobalt, or which is impermeable to oxygen in sputtered form, for instance titanium or titanium nitride. After the silicidation, the oxidation protection layer is removed together with the surplus sections of the cobalt layer.

The removal of the oxidation protection layer and of the surplus cobalt usually includes a sequence of different etching processes, since during the heat treatment, intermediate compounds or alloys comprising the material of the oxidation protection layer and the cobalt layer arise, the removal of which makes it necessary to change the etching solution.

If the oxidation protection layer is provided from titanium, then the first step involves carrying out an etch using an SC1 solution and the second step involves carrying out an etch using an SOPM solution. The SC1 solution (RCA standard clean 1) contains deionized water $H_2O$, hydrogen peroxide $H_2O_2$ and ammonium hydroxide typically in the ratio 50:2:1 and is employed at temperatures of between 25 and 70 degrees Celsius.

The SOPM solution (sulfuric ozone peroxide mixture) contains sulfuric acid $H_2SO_4$ and hydrogen peroxide $H_2O_2$ in the ratio of 84:1, for example, and is enriched with more than 100 g/m$^3$ of ozone. A typical application temperature is 100 degrees Celsius. The designations SPM solution (sulphuric acid peroxide mixture) and piranha solution are customary for a mixture containing sulfuric acid ($H_2SO_4$) and hydrogen peroxide ($H_2O_2$).

If the oxidation protection layer includes titanium nitride, then a first etch using an SC1 solution is followed, in the second step, by an etch using an SC2 solution, which may be followed by a renewed etch using an SC1 solution in a third step.

The SC2 solution (RCA standard clean 2) contains deionized water $H_2O$, hydrogen peroxide $H_2O_2$ and hydrochloric acid HCl typically in the ratio of 20:1:1 and is typically used at temperatures of between 20 and 70 degrees Celsius.

The gate electrodes of the field effect transistors include a doped polysilicon layer in a section adjoining the gate dielectric. In transistor arrangements such as are customary for memory cell arrays, for instance, the gate electrodes of the selection transistors of a plurality of memory cells that are electrically connected in parallel form sections of a contiguous connecting line (word line) via which a group of memory cells are in each case addressed. In order to reduce the electrical line resistance of such a word line, the gate electrodes are provided with an additional low-resistance metal layer bearing on the doped polysilicon layer of the gate electrode. The material of the metal layer is usually tungsten. The metal layer is usually covered by a cap layer, for example a silicon nitride cap.

After the formation of a gate electrode and the source/drain regions of a transistor, an interlayer dielectric (ILD), usually a borophosphosilicate glass (BPSG), is applied to the semiconductor substrate, which covers the semiconductor substrate and the gate electrode. Above the interlayer dielectric, connecting lines between the components formed in the semiconductor substrate are formed in a metallization level. Before the connecting lines are formed, the interlayer dielectric is opened above the source/drain regions to be connected and the gate electrodes. Native silicon oxide that forms on the silicon surface of the source/drain regions is removed by means of a buffered oxide etch (BOE solution) using an etching solution containing $NH_4F$ and HF. Contact structures that connect the source/drain regions and gate electrodes, respectively, to the connecting structures to be formed in the further procedure in the metallization level are introduced into the openings.

The silicidation is performed after the cleaning of the silicon surfaces of the source/drain regions using the BOE solution. The silicidation may alternatively be effected as a self-aligned process prior to the deposition of the interlayer dielectric (salicidation, self-aligned silicidation).

In both cases, the cobalt layer also bears in sections on the metal layer of the gate electrode.

During the removal of the oxidation protection layer and the unreacted cobalt, the metal layer is exposed to the etching liquid. When using a piranha solution as the etching liquid, the tungsten is incipiently etched and the tungsten layer is damaged, with the result that the electrical resistance of the tungsten layer is increased.

SUMMARY

One aspect of the invention includes a method of forming contacts with cobalt silicide. For example, after siliciding with the SOM solution, both unreacted sections of the deposition layer including, for example, cobalt as initial layer for the siliciding and an oxidation protection layer including titanium and deposited by means of cathode beam sputtering, for instance, may be removed rapidly and with high selectivity relative to the cobalt silicide and other, densified metal structures and metal layers.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
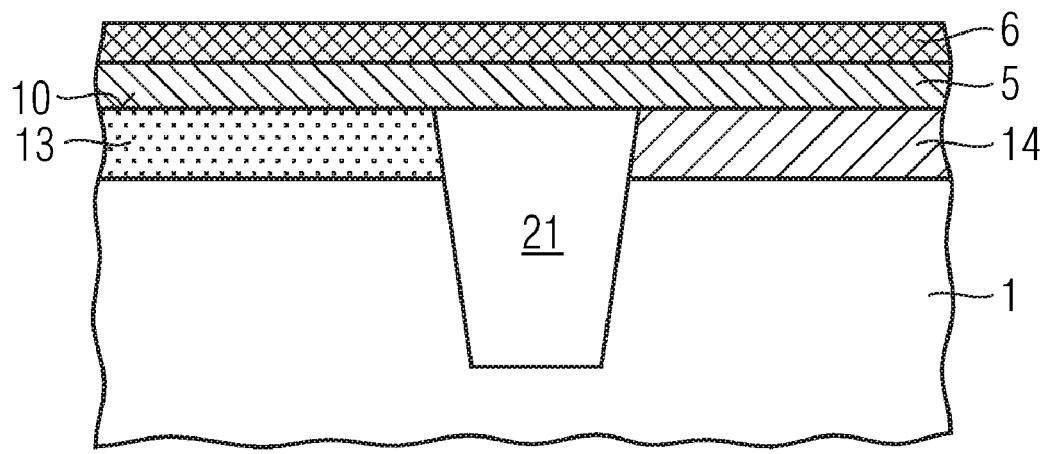
FIG. 1 illustrates a cross section through a semiconductor substrate with silicon and metal surfaces after the deposition of the refractory metal and an oxidation protection layer in the course of a processing according to an embodiment of the invention.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments of the invention relate to methods of removing a deposition layer including or composed of a low-density refractory metal in the course of fabricating a semiconductor device, in which sections of the deposition layer are removed by the action of a process liquid and a method of forming a metal silicide on a substrate surface of a substrate.

An embodiment of the invention is related to the removal of, for instance, a deposition layer including or composed of a low-density refractory metal and deposited by means of cathode beam sputtering, vapor deposition (CVD) or ALD (atomic layer deposition), said layer being applied to a substrate in the course of fabricating a semiconductor device. The deposition layer is removed by the action of a process liquid, wherein ozone-enriched sulfuric acid (sulfuric acid ozone mixture, SOM solution) is used as process liquid.

Refractory metals within the meaning of the present application are, according to the customary use of the term refractory metal in the field of semiconductor technology, the metals of secondary groups IV to VIII having melting points of greater than 1400 degrees Celsius. Refractory metals within the meaning of the present application are accordingly V, Cr, Zr, Nb, Mo, Ru, Hf, Ta, W, Re, Os, Ir, Co, and Ni.

The thickness of the deposition layer may be up to hundreds of nm. The deposition layer is, by way of example, provided with a layer thickness of less than 50 nm.

In this case, for example 50 to 200 $g/m^3$ of ozone are admixed with an approximately 96% strength sulfuric acid. The SOM solution acts on the deposition layer at a temperature of at least 80 degrees Celsius and at most 140 degrees Celsius.

According to an exemplary embodiment, approximately 100 $g/m^3$ of ozone are admixed with the sulfuric acid. The removal of the deposition layer is carried out at a temperature of approximately 100 degrees Celsius.

SOM solutions have hitherto been used as a variant with regard to SPM solutions (sulfuric acid hydrogen peroxide mixture, "Piranha" solution) exclusively for the removal of organic materials. Metal layers are usually removed by means of the SC1 and SC2 solutions already described. SC1 and SC2 solutions remove metal layers with a low selectivity with respect to other metals, and largely independently of the density thereof and the forming history thereof (ALD, CVD, cathode beam sputtering, electrochemical deposition). By comparison, it was possible to illustrate that the SOM solution, under the conditions described, can pull back low-density refractory metals selectively with respect to high-density refractory metals, or a low-density metal deposited by means of cathode beam sputtering with respect to the same metal which, however, is deposited by means of ALD and/or densified by heat treatment. In this case, the material of the deposition layer is firstly oxidized and the resultant oxidation product is dissolved in the SOM solution. The process proceeds all the more rapidly, the lower the density of the respective metal layer.

A first metal structure may be removed selectively with respect to a second metal structure, the first and the second metal structures including different refractory metals or alloys thereof. The first and second metal structures may also include the same refractory metal or the same alloy, but have different densities due to different pretreatments.

A method of fabricating a metal silicide including a low-density refractory metal on a substrate surface of a substrate may include providing a substrate having a semiconductor structure including silicon. The semiconductor structure may adjoin the substrate surface in sections. A deposition layer including the low-density refractory metal is applied to the substrate surface for instance by means of cathode beam sputtering, vapor deposition (CVD) or ALD (atomic layer deposition).

The thickness of the deposition layer may be up to hundreds of nm. By way of example, the deposition layer is provided with a layer thickness of less than 50 nm.

In the course of a thermal treatment at a temperature of less than 700 degrees Celsius, the metal silicide is formed along an interface between the semiconductor structure and the deposition layer. The unsilicided sections of the deposition layer are removed by means of a process liquid, wherein ozone-enriched sulfuric acid (SOM solution) may be used as the process liquid.

The SOM solution does not attack the metal silicide even in the event of a long time of action. The electrical contact resistance of the metal silicide may remain unchanged.

The refractory metal for metal siliciding may be, for instance, Ti, Ni or Co. According to a further embodiment, refractory metals are provided which react during the siliciding even in a nitrogen environment with oxygen outdiffusing from the substrate with formation of a metal oxide.

In this case, after the deposition of the deposition layer, an oxidation protection layer is applied to the deposition layer. The oxidation protection layer suppresses an oxidation of the deposition layer and of the underlying silicon during the thermal treatment of the substrate.

The thickness of the oxidation layer may be up to 200 nm. The oxidation protection layer may be applied with a layer thickness of less than 50 nm.

If the oxidation protection layer is also provided from a low-density refractory metal and applied by means of cathode beam sputtering, for instance, then it may be removed by the method described above together with the unreacted sections of the deposition layer in a single, fast wet etching step. In this case, alloys of the material of the deposition layer and the material of the oxidation protection layer that possibly arise temporarily do not necessitate changing the etching solution, but rather, if they arise at all, are removed in the same way as the starting materials. A significant saving of process time and process complexity may be achieved in comparison with conventional methods.

Ti, Co or Ni or an alloy thereof may be selected as the material of the deposition layer.

An oxidation protection layer is provided at any rate when Co is chosen as material of the deposition layer. The material for this is, by way of example, titanium or a titanium alloy, for instance CoTi. The etching rates of the SOM solution for sputtered titanium and sputtered Co are very high.

The thermal treatment is effected at the temperature required for forming the respective silicide. If Co is accordingly chosen as material of the deposition layer, then the thermal treatment is effected at a temperature of at least 300 degrees Celsius and at most 600 degrees Celsius. In this case, cobalt monosilicide CoSi is formed as the metal silicide.

After the removal of the sections of the deposition layer that have not been converted to metal silicide a thermal after-treatment is performed at a temperature of at least 700 degrees Celsius. In this case, the CoSi is converted into $CoSi_2$, the electrical resistance of which is lower than that of the CoSi.

When a metal structure comprising or composed of a high-density refractory metal that adjoins the substrate surface in sections is formed prior to the deposition of the deposition layer in the substrate, the high-density refractory metal may be one which either has a high specific density and/or is densified on account of the respective deposition method and/or by means of a suitable heat treatment. By way of example, a layer deposited by means of electrochemical deposition or by means of ALD usually has a higher density than a layer composed of the same element that is deposited by means of cathode beam sputtering.

The method according to one embodiment of the invention also proves to be selective with respect to such metal structures. The metal structure may be a structure buried in the substrate or a structure provided above the substrate, for instance a connecting line or part of a gate electrode of a transistor.

Contact concepts may provide forming simultaneously contact structures to gate electrodes and source/drain regions of transistor arrangements. Such contact concepts provide for forming a gate electrode of a first transistor prior to the deposition of the deposition layer on the substrate. The gate electrode has a metal layer composed of or including a high-density refractory metal. The high-density refractory metal is in turn one which either has a high specific density and/or is densified on account of the respective deposition method and/or by means of a suitable thermal treatment.

A source/drain region of the first or a second transistor is formed in the substrate. The metal layer of the gate electrode is uncovered at least in sections.

If the deposition layer and oxidation layer are then deposited successively by means of, cathode beam sputtering, the siliciding is carried out and the deposition layer and the oxidation protection layer are removed by means of the method according to one embodiment of the invention, then neither the metal silicide nor the metal layer of the gate electrode are attacked.

When sputtered tungsten is provided as the refractory metal of the metal structure in the semiconductor substrate or the metal layer of the gate electrode, a high etching selectivity with respect to sputtered Ti and sputtered Co of more than 300:1 may be achieved in SOM at 100 degrees Celsius.

In accordance with another exemplary embodiment, after the removal of the unreacted sections of the deposition layer, a rinse may be carried out using a rinsing liquid, HCl temporarily being admixed with the rinsing liquid. This may reduce contamination of the rinsing device by metal residues.

Figure 2:
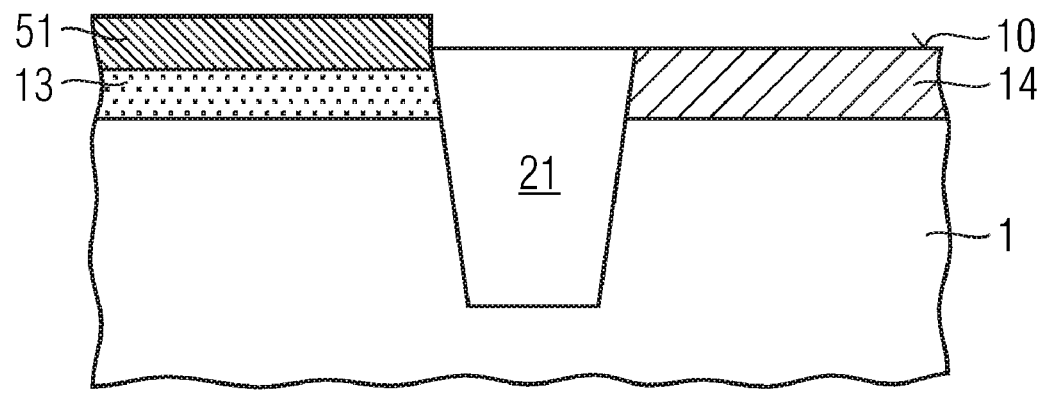
FIG. 2 illustrates a cross section through a semiconductor substrate with silicon and metal surfaces after siliciding in the course of a processing according to the embodiment of FIG. 1.
Figure 3:
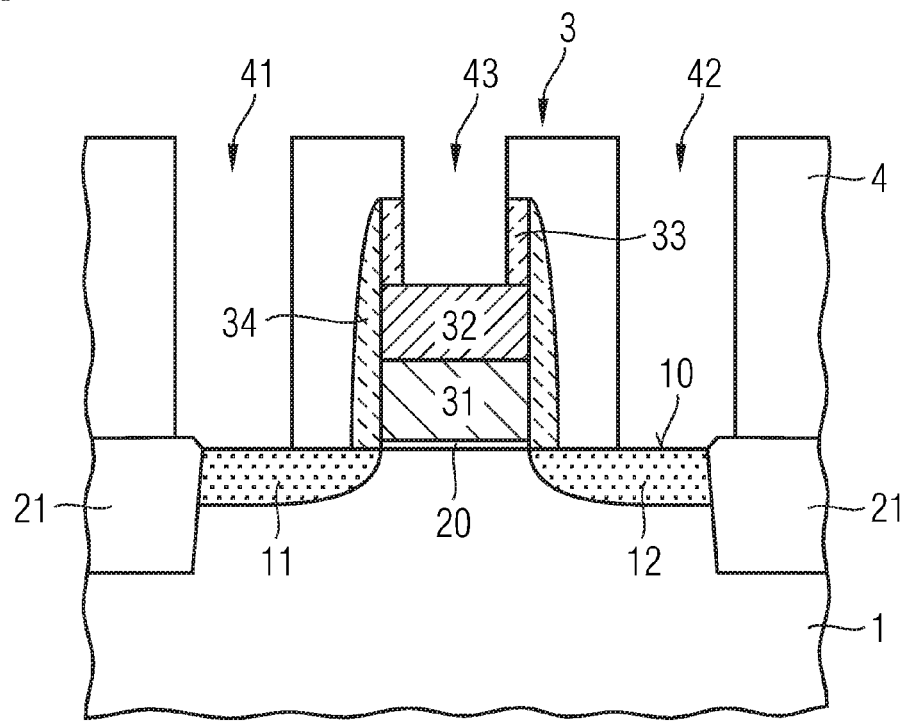
FIG. 3 illustrates a cross section through a transistor structure after the formation of contact openings in an interlayer dielectric in the course of a processing according to another embodiment of the invention.

FIGS. 1 and 2 relate to an embodiment of the invention which concerns a semiconductor substrate 1, in which a semiconductor structure 13 is formed as a doped section of the semiconductor substrate 1. The semiconductor structure 13 is, for example, a source/drain region of a transistor, an anode or cathode region of a diode or of some other semiconductor component, or a connecting structure.

A metal structure 14 is introduced in another section of the semiconductor substrate 1. The metal structure 14 is a further connecting structure, by way of example. In this example, the metal structure 14 is separated from the semiconductor structure 12 by an insulator structure 21.

The metal structure 14 is, by way of example, made of sputtered tungsten.

An approximately 15 nanometer thick deposition layer 5, for example a cobalt (Co) layer, is applied to the substrate surface 10 formed in sections by the semiconductor structure 13, the metal structure 14 and the insulator structure 21, by means of cathode beam sputtering. Alternative low-density refractory metals are for instance sputtered titanium Ti and sputtered nickel Ni.

An oxidation protection layer 6 is deposited onto the deposition layer 5 by means of cathode beam sputtering. The oxidation protection layer 6 contains titanium as further low-density refractory metal and is deposited with a layer thickness of approximately 20 nanometers.

FIG. 1 illustrates a semiconductor substrate 1 with a semiconductor structure 12, an insulator structure 21 and a metal structure 14, which adjoin a substrate surface 10 of the semiconductor substrate 1 in sections. A deposition layer 5 bears on the substrate surface 10. The deposition layer 5 is covered by an oxidation protection layer 6.

The semiconductor substrate 1 is subjected to a thermal treatment at approximately 540 degrees Celsius for the duration of approximately 20 seconds in a nitrogen environment. Part of the deposition layer 5 is silicided.

Cobalt monosilicide CoSi 51 is formed along the interface between the semiconductor structure 13 and the deposition layer 5. An oxidation of the cobalt of the deposition layer 5 or of the semiconductor substrate 1, for instance by oxygen emerging from the insulator structure 21, is suppressed by the oxidation protection layer 6.

A wet etch using an etching solution is carried out. For this purpose, the etching solution is sprayed onto the semiconductor substrate 1. As an alternative, the semiconductor substrate 1 is dipped into the etching solution.

The etching solution is an SOM solution (sulfuric ozone mixture) and contains an approximately 96% strength sulfuric acid $H_2SO_4$ enriched with 50 to 200 g/m$^3$ of ozone. The temperature of the etching solution is between 80 degrees Celsius and 140 degrees Celsius. The time of action of the etching solution is between 1 and 15 minutes in the case of the layer thicknesses mentioned.

The etching solution removes the oxidation protection layer 6 and also those sections of the deposition layer 5 that do not participate in the siliciding. The metal structure 14, the cobalt monosilicide 51 and also the insulator structure 12 are not attacked to an appreciable extent by the etching solution. The electrical resistance of the metal structure 14 and of the cobalt monosilicide 51 may remain largely unaffected.

If, on a metal structure 14 composed of, for example, tungsten, a 15 nanometer thick cobalt layer is applied as deposition layer 5 and an approximately 20 nanometer thick titanium layer is applied as oxidation protection layer 6 and removed again by said etching solution after a typical thermal treatment for the formation of cobalt silicide of approximately 540 degrees Celsius over 20 seconds, then the contact resistance of the metal structure 14 may be impaired only by at most 15%. By contrast, the use of diverse SC1 and SC2 solutions may lead to an impairment of at least 100%.

FIGS. 3 to 6 relate to another embodiment of the method according to the invention, which concerns the formation of silicided contacts for transistor structures.

A gate dielectric 20 is formed on a section of a substrate surface 10 of a semiconductor substrate 1. A gate electrode 3 is formed above the gate dielectric 20. A polysilicon layer 31 of the gate electrode 3 bears on the gate dielectric 20. A metal layer 32 of the gate electrode 3 bears on the polysilicon layer 31. The metal layer 32 is composed of tungsten, by way of example. A cap layer 33 covers the metal layer 32. The cap layer 33 is a silicon nitride layer, by way of example. At vertical sidewalls, the gate electrode 3 is bordered by gate spacers 34 that may be composed of silicon nitride.

On mutually opposite sides of the gate electrode 3, two source/drain regions 11, 12 are formed in the semiconductor substrate 1. The two source/drain regions 11, 12 are doped zones of a first conductivity type and are formed within a section of the semiconductor substrate 1 that is intrinsically conductive or has a second conductivity type opposite to the first conductivity type.

Insulator structures 21 delimit the transistor structure with respect to adjacent semiconductor structures in the semiconductor substrate 1.

A layer, for example a borophosphosilicate glass layer, is deposited over the semiconductor substrate 1 including the gate electrode 3 and planarized. The planarized layer of borophosphosilicate glass forms an interlayer dielectric (ILD) 4. In a manner corresponding to the source/drain regions 11, 12 and the gate electrode 3, contact openings 41, 42, 43 are introduced through the interlayer dielectric 4 and through the cap layer 33 of the gate electrode 3. In accordance with FIG. 3, the two source/drain regions 11, 12 are uncovered through the contact openings 41, 42 and the metal layer 32 of the gate electrode 3 is uncovered through the contact opening 43.

By means of a buffered oxide etch or a BOE solution, native silicon oxide may be removed from the surface of the uncovered sections of the source/drain regions 11, 12.

An approximately 15 nanometer thick deposition layer 5, for example a cobalt layer, is deposited by means of cathode beam sputtering. Afterward, an approximately 20 nanometer thick oxidation protection layer 6, for example a titanium layer, is deposited once again by cathode beam sputtering.

The semiconductor substrate 1 is heated in a nitrogen environment for approximately 20 seconds to a temperature of 540 degrees Celsius. A section of the deposition layer 5 is silicided. Cobalt monosilicide 51 is formed along the interfaces between the deposition layer 5 and the semiconductor substrate 1. Sections of the deposition layer 5 that bear on the silicon oxide of the insulator structures 21, the BPSG of the interlayer dielectric 4 and the silicon nitride of the cap layer 33 remain essentially unchanged.

Figure 4:
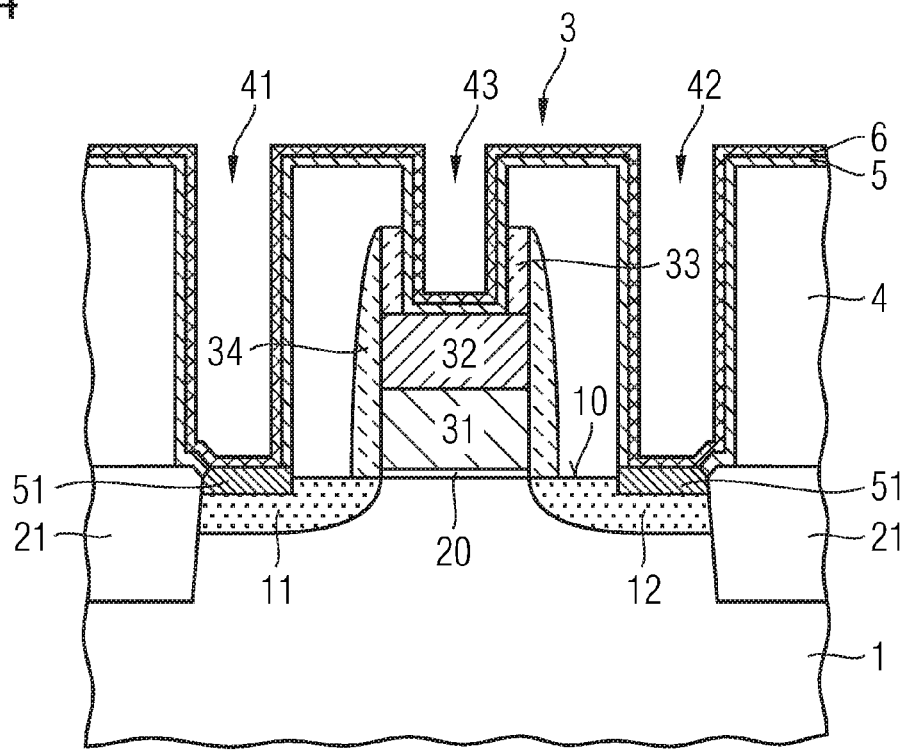
FIG. 4 illustrates a cross section through a transistor structure after the siliciding in the course of a processing according to the embodiment of FIG. 3.

FIG. 4 illustrates the deposition layer 5, whose sections that do not bear on silicon cover the interlayer dielectric 4 as a conformal layer and line the contact openings 41, 42, 43 in this case. In a section adjoining the semiconductor substrate 1, the deposition layer 5 may be more or less completely converted into the cobalt monosilicide 51, wherein silicon of the semiconductor substrate 1 is consumed during the formation of the cobalt mononsilicide 51. The oxidation protection layer 6 covers the residual sections of the unconsumed deposition layer 5 and also the cobalt monosilicide 51.

A wet etch using an etching solution is carried out. An SOM solution is used as the etching solution. The SOM solution is 96% strength sulfuric acid $H_2SO_4$ enriched with approximately 100 g/m$^3$ of ozone. The temperature of the etching solution may be approximately 100 degrees Celsius. The time of action of the etching solution must be approximately 3 minutes.

The etching solution removes the oxidation protection layer 6 and also those sections of the deposition layer 5 that did not participate in the siliciding. The metal structure 14 and the primary cobalt silicide 51 are not attacked to an appreciable extent by the etching solution. The electrical junction or contact resistance with respect to the metal structure 14 and with respect to the cobalt monosilicide 51 may remain largely unaffected. The etching rate of the titanium deposited by cathode beam sputtering is approximately 100 nm/min, and that of the cobalt deposited in the same way is significantly more than 100 nm/min. The tungsten that is deposited by means of cathode beam sputtering and likewise subjected to the thermal treatment for siliciding is attacked only to a comparatively small extent, with an etching rate of less than 0.3 nm/min. The selectivity with respect to tungsten may be greater than 300:1 in both cases. The electrical resistance of the cobalt monosilicide remains unchanged even after a time of action of the etching solution of 9 minutes.

The semiconductor substrate 1 with the cobalt monosilicide 51 is subjected to a further thermal treatment, for example at 750 degrees Celsius for 20 seconds. In the process, the cobalt monosilicide CoSi 51 is converted into a cobalt disilicide $CoSi_2$ 52 and an additional portion of silicon from the semiconductor substrate 1 is consumed. The cobalt disilicide 52 has a lower electrical resistance or contact resistance than the cobalt monosilicide 51.

Figure 5:
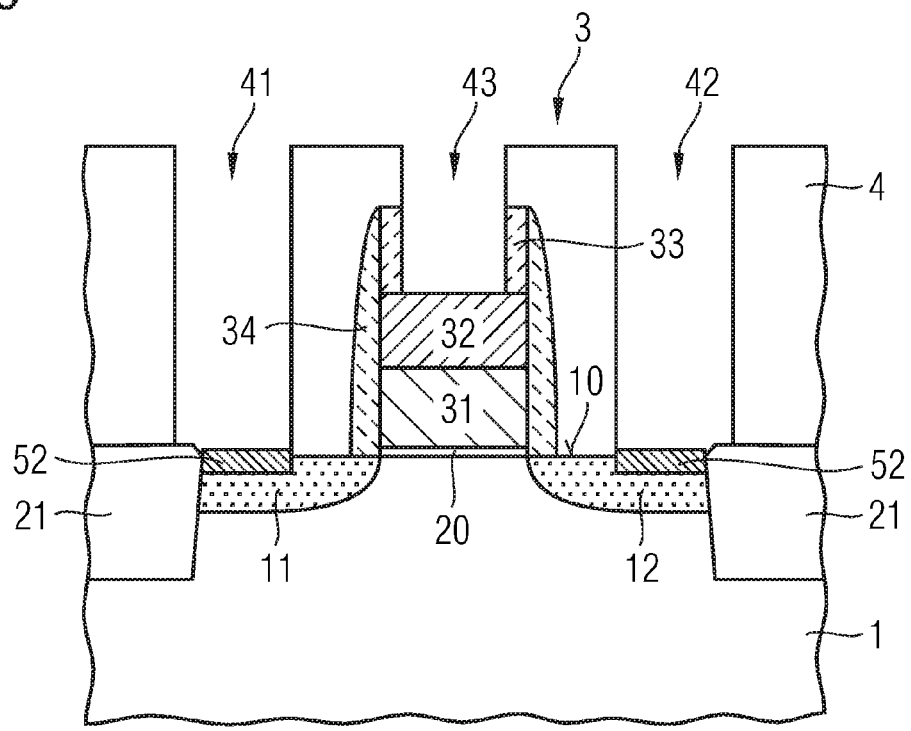
FIG. 5 illustrates a cross section through a transistor structure after the removal of an oxidation protection layer and surplus metal in the course of a processing according to the embodiment of FIG. 3 to 4.
Figure 6:
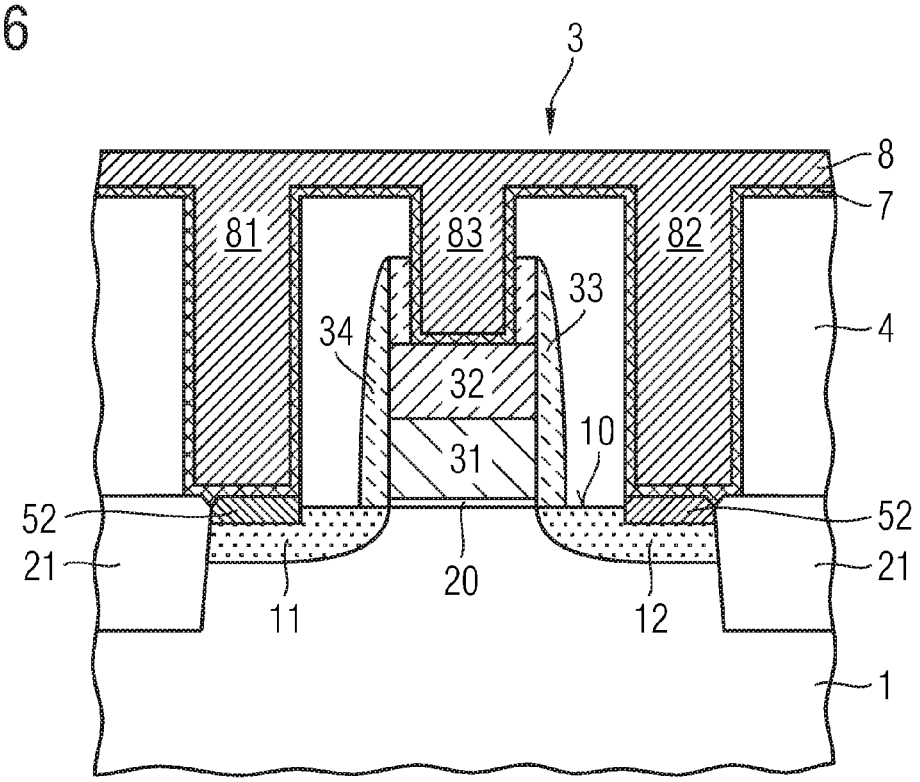
FIG. 6 illustrates a cross section through a transistor structure after the formation of contacts in an interlayer dielectric in the course of a processing according to the embodiment of FIG. 3 to 5.

FIG. 5 illustrates the cobalt disilicide 52 at the bottom of the contact openings 41, 42. The unreacted sections of the deposition layer 5 and also the oxidation protection layer 6 are completely removed. The surface of the metal layer 32 of the gate electrode 3 is unchanged.

An adhesion or initial layer 7 is deposited by means of cathode beam sputtering. The material of the adhesion layer 7 is titanium or titanium nitride, for instance. The adhesion layer 7 lines the contact openings 41, 42, 43. A contact metal 8 is deposited by means of a further deposition method, for instance by W-CVD, electrochemical deposition or cathode beam sputtering. The contact metal 8 is tungsten. It completely fills the contact openings 41, 42, 43. By means of a chemical mechanical polishing method, that portion of the contact metal 8 that was deposited above the interlayer dielectric 4 is pulled back as far as the upper edge of the interlayer dielectric 4. The contact metal 8 in the contact openings 41, 42 forms source/drain contacts 81, 82. A gate contact 83 emerges from the contact metal 8 in the contact opening 43.

The method according to one embodiment of the invention for cobalt siliciding is explained only by way of example on the basis of the transistor structure illustrated. The method according to one embodiment of the invention can also be applied for contact-connecting only one source/drain region of a first transistor in conjunction with the gate contact-connection of a second transistor. Transistor structures other than planar transistor structures, for instance FinFETs, RCATs or vertical transistor structures, may also in each case be at least partly contact-connected in a corresponding manner. The transistor structures can be integrated in logic circuits or memory cell arrays.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a metal silicide, the method comprising:
   providing a substrate including a semiconductor structure comprising silicon that adjoins a substrate surface of the substrate in sections;
   depositing a deposition layer comprising a low-density refractory metal onto the substrate surface;
   treating thermally the substrate, wherein the metal silicide is formed along an interface between the semiconductor structure and the deposition layer; and
   removing the non-silicided sections of the deposition layer by means of a process liquid comprising ozone-enriched sulfuric acid (SOM solution).

2. The method of claim 1, further comprising,
   applying, after depositing the deposition layer, an oxidation protection layer to the deposition layer, the oxidation protection layer suppressing an oxidation of the deposition layer during the thermal treatment; and
   removing the oxidation protection layer after the thermal treatment by means of the process liquid all together jointly with the deposition layer.

3. The method of claim 1, wherein one of a group comprising Ti, Co, Ni and an alloy thereof is chosen as material of the deposition layer.

4. The method of claim 2, wherein one of a group comprising Ti, Cr, V and an alloy thereof, and Co is chosen as material of the oxidation protection layer.

5. The method of claim 2, wherein Co is chosen as material of the deposition layer and the thermal treatment is performed at a temperature of at least 300 degrees Celsius and at most 600 degrees Celsius to form CoSi as metal silicide.

6. The method of claim 5, further comprising, after the removal of the sections of the deposition layer that have not been converted to metal silicide, performing a thermal aftertreatment at a temperature of at least 700 degrees Celsius to convert the CoSi into $CoSi_2$.

7. The method of claim 1, further comprising, prior to the deposition of the deposition layer, forming a metal structure that adjoins the substrate surface in sections in the substrate, the metal structure emerging from a high-density refractory metal, the high-density refractory metal being one which either has a high specific density and/or is densified on account of the respective deposition method and/or by means of a suitable heat treatment.

8. The method of claim 1, further comprising:
   prior to the deposition of the deposition layer, forming a gate electrode of a first transistor on the substrate, said gate electrode having a metal layer comprising a refractory metal, the metal layer emerging from a high-density refractory metal, the high-density refractory metal being one which either has a high specific density and/or is densified on account of the respective deposition method and/or by means of a suitable heat treatment;
   providing a source/drain region of the first or of a second transistor as the semiconductor structure; and
   uncovering the metal layer of the gate electrode at least in sections.

9. The method of claim 7, wherein tungsten is provided as the high-density refractory metal.

10. The method of claim 4 further comprising, after the removal of the deposition layer, removing the process liquid in a rinsing device in a rinsing process by means of a rinsing liquid, HCl being admixed temporarily with the rinsing liquid.

11. The method as claimed in claim 1, wherein highly concentrated sulfuric acid is used as the process liquid, 50 to 200 $g/m^3$ of ozone are admixed with the sulfuric acid, and the deposition layer is removed at a process liquid temperature of at least 80 degrees Celsius and at most 140 degrees Celsius.

12. The method of claim 11, wherein 75 to 96% strength sulfuric acid is used as the process liquid, approximately 100 $g/m^3$ of ozone are admixed with the sulfuric acid, and the deposition layer is removed at a process liquid temperature of approximately 100 degrees Celsius.

* * * * *